Feb. 2, 1965 J. D. AHEARN 3,167,779

TRANSISTOR CLINCHER

Filed Oct. 7, 1963 2 Sheets-Sheet 1

INVENTOR

JOSEPH D. AHEARN

BY Feldman & Wolffe

ATTORNEY

TRANSISTOR CLINCHER

Filed Oct. 7, 1963

2 Sheets-Sheet 2

INVENTOR
JOSEPH D. AHEARN

BY [signature]

ATTORNEY

United States Patent Office 3,167,779 Patented Feb. 2, 1965

3,167,779
TRANSISTOR CLINCHER

Joseph D. Ahearn, Binghamton, N.Y., assignor to Universal Instruments Corporation, Binghamton, N.Y., a corporation of New York Filed Oct. 7, 1963, Ser. No. 314,255
12 Claims. (Cl. 1—210)

The present invention relates to a machine for use in the automatic fabrication of printed circuit boards and more specifically to a device for clinching the wires of a radial lead electrical component to the bottom of a board after its insertion. More particularly, the machine provides for radially outward positioning of lead wires while the electrical component is held tightly to the board.

Clinching devices are common in the art for such electrical components as resistors, diodes, and capacitors, which possess only a pair of lead wires arranged within a single plane. The most common of these clinching devices comprise rotary anvils, mounted beneath the printed circuit board, which wipe across the wires protruding therethrough to bend each down in a line approximately tangent to a circle through the lead roots whose center would be the midpoint between them. The rotary clincher is not feasible where three or more lead wires are present due to the possibility that after clinching the ends of the wires will overlap and cause a short circuit.

Other common clinching devices utilize pairs of pivoted or reciprocating benders, with individual elements for bending each lead wire. Such a device becomes extremely expensive and complicated when three or more lead wires are present and an equal number of benders are needed. The use of multi-lead radial components has become widespread with the advent of transistors and the more recent micro-modules and other small integrated electronic assemblies necessary due to the trend toward miniaturization.

The holding of the electrical component to the printed circuit board with enough pressure to clinch the leads close enough to the board to hold the component securely also presents a problem. Very often, the required pressure on the upper face of a component from above, will buckle the board downwardly, causing a separation between the board surface and the circuitry thereon and even cracking of the board.

It is a general object of the present invention to provide a machine that will meet all of the above desideratum.

A more specific object of the present invention is to provide a versatile machine that will clinch the leads of most multi-lead electrical components from two lead resistors and three lead transistors, to micro modules having four, five, or more leads.

Another object of the present invention is to provide a machine that will clinch the lead wires of a multi-lead component to a circuit board in an outwardly extending pattern to prevent overlapping and resultant shorting of the lead wires.

A further object of the present invention is to provide a lead clinching machine which will support the lower face of a circuit board between the leads of a transistor during automatic insertion of the transistor into the circuit board and the application of pressure from above the board during the clinching operation.

A still further object of the present invention is to provide a lead clinching machine capable of holding an electrical component tightly to the board during the lead straightening operation after hand insertion of the component.

Yet another object of the present invention is to provide a lead clinching machine for automatically, in sequence; applying pressure or support to a circuit board from beneath the circuit board, between the lead wires of an inserted transistor, bending the leads radially outward, and then clinching them flat to the circuit board.

Other objects of the present invention will be apparent from the following description taken in conjunction with the accompanying drawings, wherein.

Figures 1, 5:
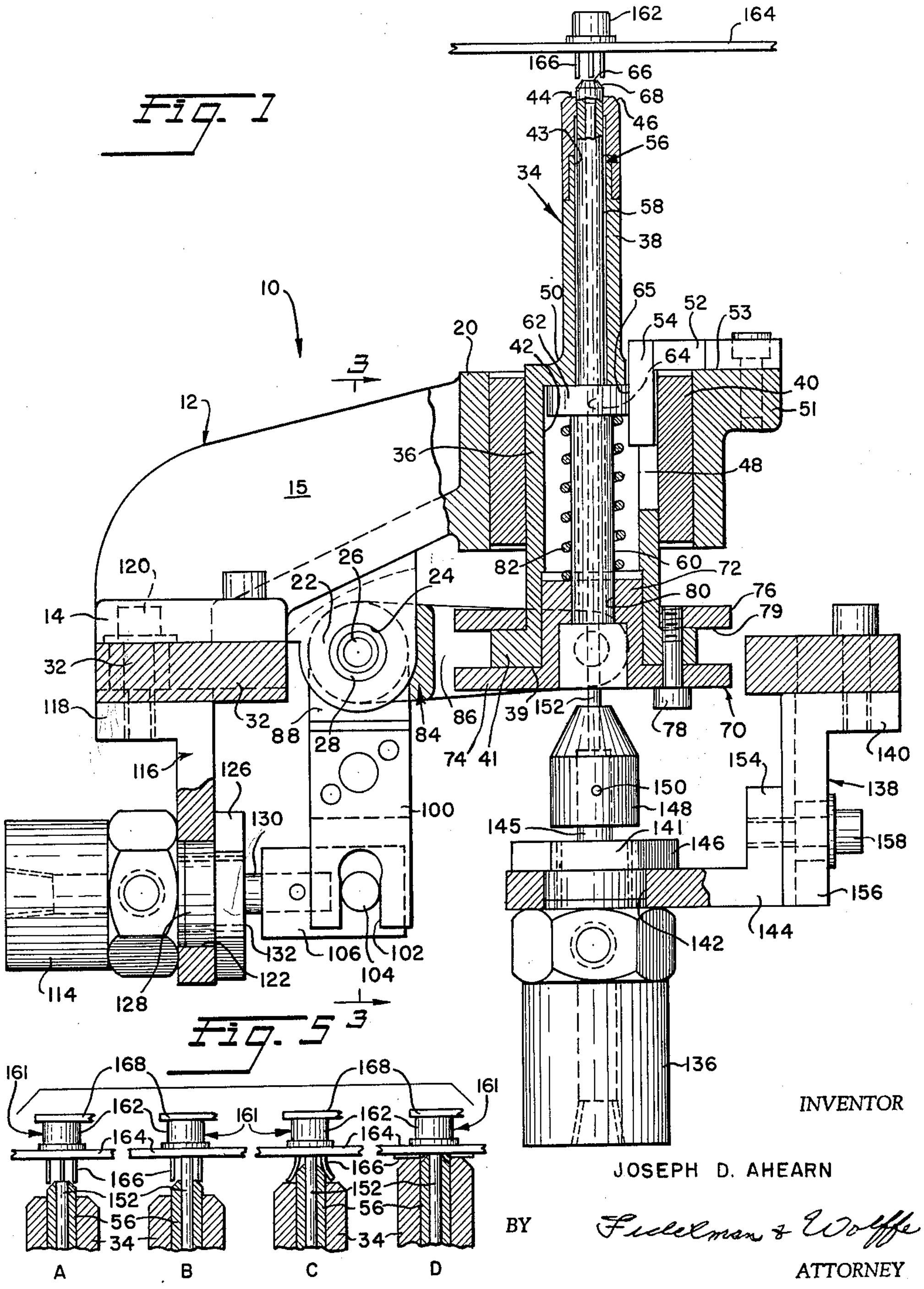
FIG. 1 is a side elevational view of an electrical component lead clincher of the present invention illustrating the actuating mechanism in partial cross-section.
Figures 2, 3, 4:
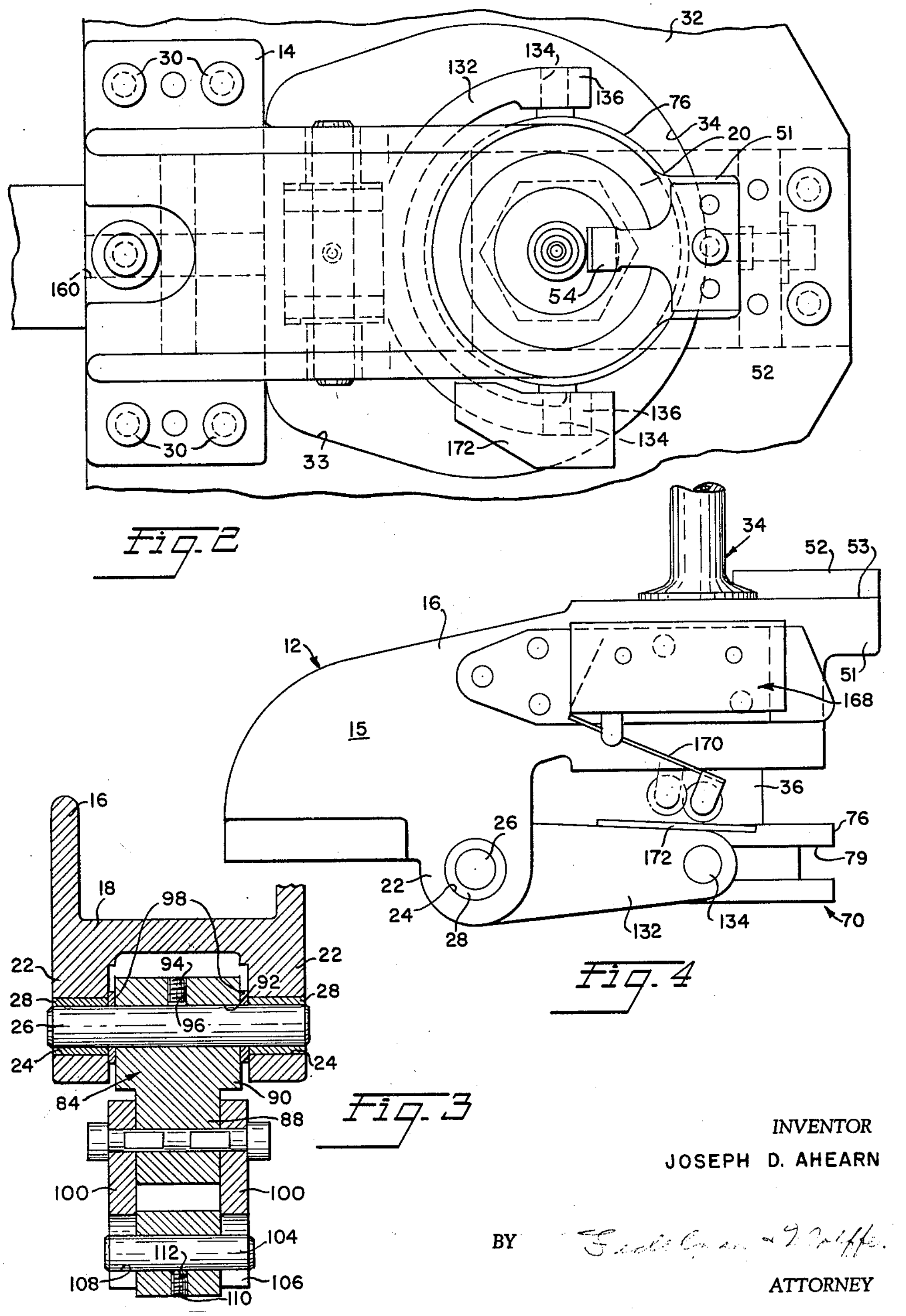
FIG. 2 is a top plan view of the lead clincher of FIG. 1.
FIG. 3 is a cross-sectional view of the lead clincher of the present invention taken through line 3—3 of FIG. 1.
FIG. 4 is a side elevation view of a portion of the lead clincher showing in particular the positioning of a reversing switch, and FIG. 5 (A, B, C, and D) is a series of diagrammatic representations, in sequence, of the relationship of the elements of the lead bending and clinching unit during the clinching of the leads of a three lead transistor.

Referring to the drawing, FIGS. 1–3 in particular, the lead bending and clinching unit, generally designated 10, has a main body section, generally designated 12 consisting of a horizontal base plate 14 and an outwardly extending arm 15 comprised of a pair of parallel vertical side members 16 with an interconnecting perpendicular web 18 extending the length of said side members 16. The outer ends of the arm 15 terminates in a cylindrical tube 20 having a vertical axis. A pair of parallel ears 22 extends downwardly, one from each of the side members 16 below the web 18 and between the base plate 14 and the cylindrical tube 20. The pair of ears 22 have coaxial holes 24 for journalling a shaft 26 therein by bearings 28. The base plate 14 extends beyond the side walls 16 of the arm 15 with pairs of mounting bolts 30 extending through the extensions of the base plate 14 on either side of the arm 15 to hold the clinch unit body section 12 to a work table top 32. The table top 32 has an oval shaped hole 33 beneath the outwardly extending arm 15 and the cylindrical tube 20 and extending a distance beyond the sides and end thereof.

An outer anvil 34, having a cylindrical lower section 36 with a circular, radial flange 41 integral with the lower face 39 thereof, and a necked-down upper cylindrical section 38, is reciprocatable in the cylindrical tubular section 20 of the main mounting section 12. A tubular anti-friction insert bearing 40 is force-fitted into the tubular section 20 and snugly surrounds the outer anvil 34, above the flange 41. The lower section 36 of the outer anvil 34 has a concentric circular passage 42 extending through the lower face 39 thereof and ending adjacent its upper face 50 where it connects with a smaller diameter coaxial circular passage 43 extending through the upper end of the lower section 36 and the upper section 38 and through its upper flat forming face 44. The forming face 44 of the outer former 34 is perpendicular to the axis of the outer anvil 34 and has a continuous edge bevel 46.

The lower cylindrical section 36 of the outer anvil 34 has a narrow slot 48, parallel to its axis and extending through its upper face 50, connecting with the circular passage 42. A boss 51, formed at one side of the tubular section 20 rigidly mounts a key 52 on its upper face 53. The key 52 has a depending rectangular finger 54 extending downwardly inside of the anti-friction bearing 40 and mating with the narrow slot or keyway 48 in the lower section 36 of the outer former 34 to prevent rotation thereof.

An inner anvil generally designated 56, is composed of upper and lower coaxial cylindrical tubes 58 and 60, respectively, delineated by an intermediate circular flange 62 and having a continuous coaxial passage 64, the upper and lower ends of the inner anvil 56 being open to provide a continuous passage therethrough. The inner anvil 56 is slidably held within the outer anvil 34 by its upper tube portion 58 which fits snugly within the passage 43 in the upper necked down section 38 of the outer anvil 34. The intermediate flange 62 and the lower tubular portion 60 of the inner anvil 56 lie within the circular passage 42 in the lower section 36 of the outer anvil 34 with a keyway 65 in the intermediate flange 62 also communicating with the depending finger 54 of the key 52 to prevent rotary movement of the inner anvil 56. When the inner anvil 56 is in its uppermost position within the outer anvil 34 with its intermediate flange abutting the upper end of the circular passage 42, the upper end of the upper tubular portion 58 of the inner anvil 56 extends through the upper planar face 44 of the outer anvil 34. The upper face of the inner anvil 56 is a frustoconical surface 66 formed by a circumferential beveled edge 68 extending from the edge of the continuous passage 64.

Fixed to the lower face 39 of the outer anvil 34 is a cup shaped element generally designated 70 having a central thickened portion 72 fitting tightly into the lower end of the circular passage 42 and a circular concentric outer flange portion 74 lying adjacent to and extending beyond the flange 41 on the outer anvil 34. A flat ring 76, of the same diameter as flange 74 of the cup shaped element 70, fits tightly over the lower cylindrical section 36 of the outer anvil 34 and overlies the upper face of the flange 41. The ring 76, the flange 41, and the cup shaped element 70, are connected by a series of bolts 78 (one shown in FIG. 1) extending from the flange 74 of the cup shaped element 70 through concentric holes in the flange 41 and threaded into the ring 76. This combination of elements forms a circumferential composite groove 79 adjacent the lower end of the outer anvil 34. The central section 72 of the cup shaped member 70 has a coaxial passage 80 to slidably receive the lower end of the lower tubular portion 60 of the inner anvil 56. Within the passage 42 in the lower portion 36 of the outer anvil 34 and encircling the tubular portion 60 is a compression spring 82 abutting the upper face of the cup shaped member 70 at its lower end and the lower face of the intermediate flange 62 of the inner anvil 56 at its upper end thereby holding the inner anvil 56 extending upwardly through the outer anvil 34 (as shown in FIG. 1).

The shaft 26, journalled beneath the arm 15 of the main body section 12 mounts a bell crank, generally designated 84, having a substantially horizontal leg 86 and a substantially vertical leg 88, in the same plane, extending through the oval aperture 33 in the table top 32. The center portion 90 of the bell crank 84 has a transverse hole 92 through which the shaft 26 extends, held tightly by a set screw 94 threaded into an interconnecting radial passage 96 and abutting the shaft 26. A thrust washer 98 is journalled on the shaft 26 on each side of the center section 90 of the bell crank 84 adjacent the ears 22 to center the crank and reduce friction. A pair of parallel rectangular flat plates 100 are fixed to opposite sides of, and extend down beyond, the vertical leg 88 of the bell crank 84. A pair of aligned rectangular slots 102 extends upwardly from the lower ends of the plates 100 to provide a sliding connection with a pin 104 extending through a block 106 residing between the lower ends of the plates 100, the pin 104 being held firmly in place in a passageway 108 in the block 106 by a set screw 110 threaded into a radially intersecting passageway 112 and abutting the pin 104.

A first fluid actuator 114 is mounted beneath the table top 32 by means of an L shaped bracket 116 having a horizontal leg portion 118 for mounting the bracket 116 by a bolt 120 extending through the table top 32 and threaded into the horizontal leg 118. A threaded boss 128 on one side of the first fluid actuator 114 is fixed in a mounting hole 122 in the vertical leg 124 of the mounting bracket 116 by a nut 126. A horizontally reciprocating piston shaft 130 extends through the outer face 132 of the boss 128 with its outer end being held within one end of the block 106 by a force fitted pin extending through the block 106 and the shaft 130. The application of fluid pressure within the actuator 114 drives the shaft 130 outwardly, with the block 106 and pin 104 moving it in a horizontal line, and causing the bell crank 84 to be rotated counterclockwise.

The outer end of the horizontal arm 86 of the bell crank 84 is bifurcated, forming a semicircular yoke 132 partially surrounding the lower section of the outer anvil 34. The yoke 132 is operatively connected to the outer anvil 34 by a pair of inwardly extending coaxial dowels 134 fixed in diametrically opposed parallel terminal bosses 136 on the ends of yoke 132, and slidably received in opposite sides of the outer anvil 34 within the circumferential composite groove 79. Therefore as the bell crank 84 is rotated counterclockwise by the piston shaft 130, the sliding connection between the yoke 132 and the groove 79 drives the inner and outer anvils 56 and 34, respectively, upward.

A second fluid actuator 136 is mounted beneath the table top 32 and directly under the anvils 34 and 56 by a composite bracket 138 fixed to the underside of the table top 32, beyond the main body section 12 of the clinch unit 10, by a horizontal mounting leg 140. A threaded boss 141 on one end of the second fluid actuator 136 extends vertically through a mounting hole 142 in an actuator mounting leg 144 and is held in place by a nut 146 secured on the outer end of the boss 141. A vertically reciprocatable piston shaft 145 extends through the outer end of the boss 141 of the second actuator 136 and fixedly carries on its upper end a vertical axis cylindrical chuck 148 held by a force fitted roll pin 150 driven through concentric holes in the two elements. The vertical axis of the chuck 148 is coincidental with the axes of the tubular section 20 of the main body section 12 and the anvils 34 and 56. A board supporting assembly rod 152 is centrally mounted in the upper face of chuck 148 and extends up through the hollow interior of the inner anvil 56 being slidably held, by a snug fit within the passage 64 in the intermediate flange 62 and the hollow interior of the upper tubular section 58. In the lower, unactuated position of the actuator 136 (as shown in FIG. 1) the rod 152 extends upwardly almost the entire length of the nested anvils 34 and 56, ending just below the upper face 44 of the outer anvil 34.

The vertical mounting position of the fluid actuator 136, which controls the position of the upper end of the rod 152, can be adjusted by changing the relative positions of vertical legs 154 and 156 of the composite bracket 138 by loosening a bolt 158, slidably fixed in a vertical slot (not shown) in the leg 156 and threaded into leg 154, sliding the leg 154 up or down and retightening the bolt 158. The vertical at rest position of the anvils 34 and 56 (as also shown in FIG. 1) can be adjusted by loosening the bolt 120 fixed through a horizontal slot 160 (FIG. 2) in the table top 32 and sliding the mounting bracket 160 forward or backward after which the bolt is retightened.

The operation of the lead bending and clinching mechanisms when used with manual component insertion, is shown diagrammatically in FIG. 5 (A, B, C and D). In FIG. 5A is shown an electrical component, generally designated 161, that has been inserted in a circuit board 164 with the leads 166 thereof extending downwardly through a matching series of mating holes in said board 164. The board 164 is placed with the component body 162 under a rigid back up plate 168 and centered over the anvils 34 and 56 which at their at-rest positions, lie just behind the ends of the leads 166.

FIG. 5B shows the second step in the process wherein by applying fluid pressure to the actuator 136, the rod 152 is moved upward under the component 161 and the circuit board 164, between the leads 166, to clamp the board 164 and the body 162 of the component 161 tightly together against the back up plate 168. If the clincher mechanism 10 is used in cooperation with an automatic insertion machine the inserter head (not shown) will hold the component body 162 down against the board 164 while the rod 152 applies back up pressure. The actuation of the fluid actuator 136 in such a system may be controlled automatically by the inserter control in any one of many known ways.

Looking at FIG. 5C, the anvils 34 and 56 are now driven upward by an application of fluid pressure to the fluid actuator 114 which is either manually activated or automatically controlled in relation to the application of pressure to the actuator 136 in any known manner. As the combination of the anvils 34 and 56 raise upward, the spring 82 holds the inner anvil 56 extended so that the beveled face 68 thereof will bend the lead wires 166 radially outward. After the inner anvil 56 has been completely extended and has partially folded over the leads 166, the outer anvil 34 continues to move upward compressing the spring 82. The flat face 44 of the outer anvil 34 forces the lead wires 166 flat against the bottom face of the circuit board 164 (FIG. 5D). The fluid pressure in both actuators 114 and 136 is now vented releasing the board 164 with its clinched component 161.

The forming faces 68 and 44 of the outer and inner anvils 34 and 56, respectively, may be lightly radially V-grooved to accept the lead wires 166 and prevent any possible non-radial clinching.

While in FIG. 5, the component body 162, shown, is held tightly to the board 164, it is often the case that an air space is left between the body 162 and the board 164 for ventilation. This may be accomplished by means of a spacer therebetween, tiplets or by deforming the lead wires 166 adjacent the component body 162. The pressure on the clamping rod 152 should be adjusted to hold the component body 162 tightly to the board without crushing or collapsing any intermediate standoff.

FIG. 4 shows an embodiment using a reversing switch 168 mounted on the outer face of one side member 16 of the main body section 12 and having a pivoted lever 170 hanging downwardly with its roller contact lying on a switch plate 172 fixed to the upper face of the yoke 132 just under the switch 168. When the yoke 132 has risen to a predetermined position the switch 168 is actuated to activate a solenoid (not shown) and vent the fluid actuators 114 and 136.

The structure described is designed for clinching the leads of components, when the leads are arranged in a circular pattern. However, without departing from the spirit of the invention a machine could be constructed to clinch leads arranged in almost any configuration, such as: a square, a hexagon, octagon, etc. This could be accomplished by redesigning the anvils and the bearing within which they are carried, so that they are of the proper polygonal cross-section. If the anvils were of a polygonal cross section, an added advantage accruing would be that they could not rotate and the key and slot could be omitted. Whether the anvils are round or polygonal, a single machine could be designed for all lead patterns with the anvils accepting removable bending and clinching heads corresponding to the different patterns.

While fluid actuation of the clamping rod and the anvils has been described in conjunction with the embodiment illustrated, it is conceivable that electromagnetic actuators might be substituted if desired. Also the actuation could be manual, for instance, with the clamping rod driven up by a foot pedal and the bell crank connected to a hand actuated lever.

Thus there has been provided a machine for clinching electrical components to a circuit board, which is readily adjustable and adaptable to manual or automatic use.

Further, the bend clinch unit is capable of rapid, efficient bending and clinching of transistors and other electrical components in an economical fashion.

It will be obvious to those skilled in the art that various changes may be made without departing from the spirit of the invention and therefore the invention is not limited to what is shown in the drawings and described in the specification but only as indicated in the appended claims.

What is claimed is:

1. An electrical component handling device for bending and clinching the leads of components to a board, each component having a body section and a series of parallel wire leads extending outwardly from a side thereof, the body section of a component residing on a first face of said board with each of the leads to be bent and clinched extending through the board perpendicular thereto, and outwardly of a second face of said board; a means adjacent the first face of said board for locating said component body section against said board, a clamping rod situated adjacent and perpendicular to the second face of said board, means to reciprocate said rod against said board between the parallel leads of said component, a bending and clinching means situated adjacent and perpendicular to the second face of said board, means to reciprocate said bending and clinching means to bend and clinch said leads to said board while the clamping rod abuts against said board to support it.

2. The handling device of claim 1 wherein said bending and clinching means is at least one cylindrical tube having a coaxial passage extending therethrough and said clamping rod extending through said coaxial passage.

3. The handling device of claim 2 wherein the bending and clinching means comprises a cylindrical outer anvil and a cylindrical inner anvil, said clamping rod extending through a coaxial passage in the inner anvil and said inner anvil extending through a coaxial passage in said outer former.

4. In an electrical component lead bending and clinching device, a cylindrical outer anvil, said outer anvil having a large diameter lower section and a small diameter upper section, a coaxial bore extending through said outer anvil, and a planar lead contacting face on the upper end of said outer anvil, perpendicular to the axis thereof; a cylindrical inner anvil, said inner anvil residing within the coaxial bore of said outer anvil, said inner anvil having a cylindrical bore extending the length thereof, and a non-planar lead contacting face on the upper end of said inner former, a means for yieldably interconnecting said inner and outer anvils, a means for reciprocating said interconnected anvils in response to a first actuator means, a support rod, said rod extending through said cylindrical bore of said inner anvil, means for reciprocating the support rod through said cylindrical bore of said inner anvil in accordance with a second actuating means.

5. The electrical component lead bending and clincher of claim 4 wherein the interconnecting means between said inner and outer anvils comprises; a large diameter lower section of the bore of the outer anvil and a small diameter upper section of said bore of the outer anvil, a flat abutting surface formed in the lower bore section of said outer anvil at the junction of the large and small bore sections, an intermediate perpendicularly radial flange on said inner anvil between upper and lower sections of the inner anvil, and having upper and lower planar faces, said radial flange being of a larger diameter than the small bore section and of a smaller diameter than the large bore section of the outer anvil, said radial flange and the lower section of said inner anvil residing within said large bore section of the outer anvil and the upper section of said inner anvil residing in the upper bore section of the outer anvil, a cup shaped element fixedly mounted on the lower end of the outer anvil covering the lower end of said lower bore section, and having a coaxial bore through which the lower section of said inner anvil extends outwardly thereof, a compression spring mounted in the larger bore section of said outer anvil encircling said lower section of the inner anvil and abutting the lower face of said radial flange and the portion of the cup-shaped element extending over the lower end of the bore in the outer anvil.

6. The electrical component lead bending and clincher of claim 5 wherein said larger diameter section of said outer anvil is reciprocatably mounted in a fixed holding means, a slot extending through the large diameter section of the outer anvil into the bore and parallel to the axis thereof, a parallel slot formed through the radial flange on the inner anvil, a key mounted on the holding means and extending through said slots to prevent rotation of the inner and outer anvils.

7. The electrical component lead bending and clincher of claim 5 wherein the means for reciprocating the anvils comprises; a radially grooved ring affixed to the lower end of the outer anvil, a pivoted bell crank mounted on the holding means with a first arm thereof connected to the grooved ring by a slide yoke connection, a first reciprocatable shaft connected to said first actuating means, a second arm of the bell crank, said first reciprocatable shaft being connected to said second arm of the bell crank by a pin and slot connection, adjusting means for positioning the first actuator on the holding means to reposition the said first reciprocatable shaft to change the stroke of said anvils.

8. The electrical component lead bending and clincher of claim 7 wherein the means for reciprocating said support rod comprises, a second reciprocatable shaft connected at one end to the second actuator means, a chuck fixed on the second end of said second shaft with an oppositely facing work gripping means, said work gripping means mounting the lower end of said support rod, adjusting means for repositioning said second actuating means on the holding means for repositioning the second shaft and changing the stroke of said rod.

9. The electrical component lead bending and clincher of claim 7 wherein the first and second actuator means are each a fluid actuator having a cylinder thereof connected at one end to a source of fluid pressure and the other end containing a reciprocatable piston connected to the respective reciprocating shaft.

10. A bending and clinching means for components as described in claim 11 wherein a clamping rod extends through the inner of said nest of tubes, said clamping rod being actuatable to reciprocate upward to support said board between the wires of a component during the bending and clinching operation.

11. A bending and clinching means for a component having several parallel deformable wires extending therefrom in a substantially circular pattern and through holes in substantially flat board from a first planar face of said board to a second planar face of said board, a body portion of said component positioned adjacent the first face of said board, free ends of said wires extending outwardly of said second face of said board; a means for holding said component body tightly to said first board face, means for simultaneously bending and clinching all of the wires of said component against the second face of said board with the free ends of each of said wires fixed in a radial with respect to the center of said circular pattern, said bending and clinching means comprising a pair of nesting concentric circular tubes slidably fixed perpendicular to said board and having wire contacting upper faces wherein a first of said tubes reciprocates upwardly causing its upper face to simultaneously bend each of the wires outwardly to a position at which each wire is at an acute angle with the second face of the board; the second of said nested tubes reciprocates upward causing its upper face to flatten the portion of each of the wires extending from the second face of the board, said wires each being flattened against said second face of said board over the entire length of said portion of the wire extending through the second face of said board.

12. An electrical component handling device for bending and clinching the leads of components to a board, each component having a body section and a series of parallel wire leads extending outwardly from at least one side thereof, the leads of each of said components, to be bent and clinched, extending perpendicularly through the board from a first face thereof, whereon the component body section resides, and outwardly of a second face of said board; means adjacent said second face of said board for supporting said board tightly against said component body between said leads of the component, means adjacent said second face of said board for bending and clinching said leads tightly to the second face of the board, means for driving said support means into supporting contact with said second face of said board prior to the bending and clinching operation and holding the board supported during said operation and for driving said lead bending and clinching means towards said second face of said board to bend and clinch said leads after the board is supported by the support means.

References Cited by the Examiner

UNITED STATES PATENTS

| | | | |
|---|---|---|---|
| 2,746,041 | 5/56 | Heeley | 1—322 X |
| 2,926,354 | 3/60 | Clewes | 1—250 |
| 2,968,809 | 1/61 | Foreman et al. | 1—321 |

GRANVILLE Y. CUSTER, Jr., *Primary Examiner.*